United States Patent [19]

Wells

[11] Patent Number: 4,999,642
[45] Date of Patent: Mar. 12, 1991

[54] TRANSMISSION LINE COUPLING DEVICE WITH CLOSED IMPEDANCE MATCHING LOOP

[76] Inventor: Donald H. Wells, 7134 Railroad St., Holland, Ohio 43528

[21] Appl. No.: 347,562

[22] Filed: May 5, 1989

Related U.S. Application Data

[63] Continuation of Ser. No. 162,633, Mar. 1, 1988, abandoned.

[51] Int. Cl.⁵ .................. H03H 11/28; H01Q 9/16
[52] U.S. Cl. ...................... 343/822; 343/860; 343/715; 333/24 C; 333/32; 333/33
[58] Field of Search ................ 333/24 C, 32, 33; 343/816, 822, 829, 858, 860, 715

[56] References Cited

U.S. PATENT DOCUMENTS

| | | | |
|---|---|---|---|
| 1,778,395 | 10/1930 | Lindenblad | 343/704 X |
| 2,109,219 | 2/1938 | McKeel | 333/32 |
| 2,190,131 | 2/1940 | Alford | 333/33 X |
| 2,226,686 | 12/1940 | Alford | 333/33 X |
| 2,245,693 | 6/1941 | Lindenblad | 343/816 |
| 2,344,884 | 3/1944 | Kirkland | 343/822 X |
| 2,448,036 | 8/1948 | Libby | 343/728 X |
| 2,530,995 | 11/1950 | Rumpf, Jr. | 333/32 X |
| 2,829,367 | 4/1958 | Rychlik | 333/32 X |
| 3,262,075 | 7/1966 | Podell | 333/32 |
| 4,764,773 | 8/1988 | Larsen et al. | 333/32 X |

Primary Examiner—Eugene R. Laroche
Assistant Examiner—Benny T. Lee
Attorney, Agent, or Firm—William P. Hickey

[57] ABSTRACT

A transformer or coupling device having differing impedances and comprising a pair of conductors each constructed and arranged to have a standing wave in one which is a mirror image of the standing wave in the other so that the impedance varies from near zero at one end of the conductors to a maximum near their center. The transformer having an impedance matching that of one device to be coupled and having output terminals connected to points on the other conductor having an impedance matching that of the other device to be coupled.

19 Claims, 4 Drawing Sheets

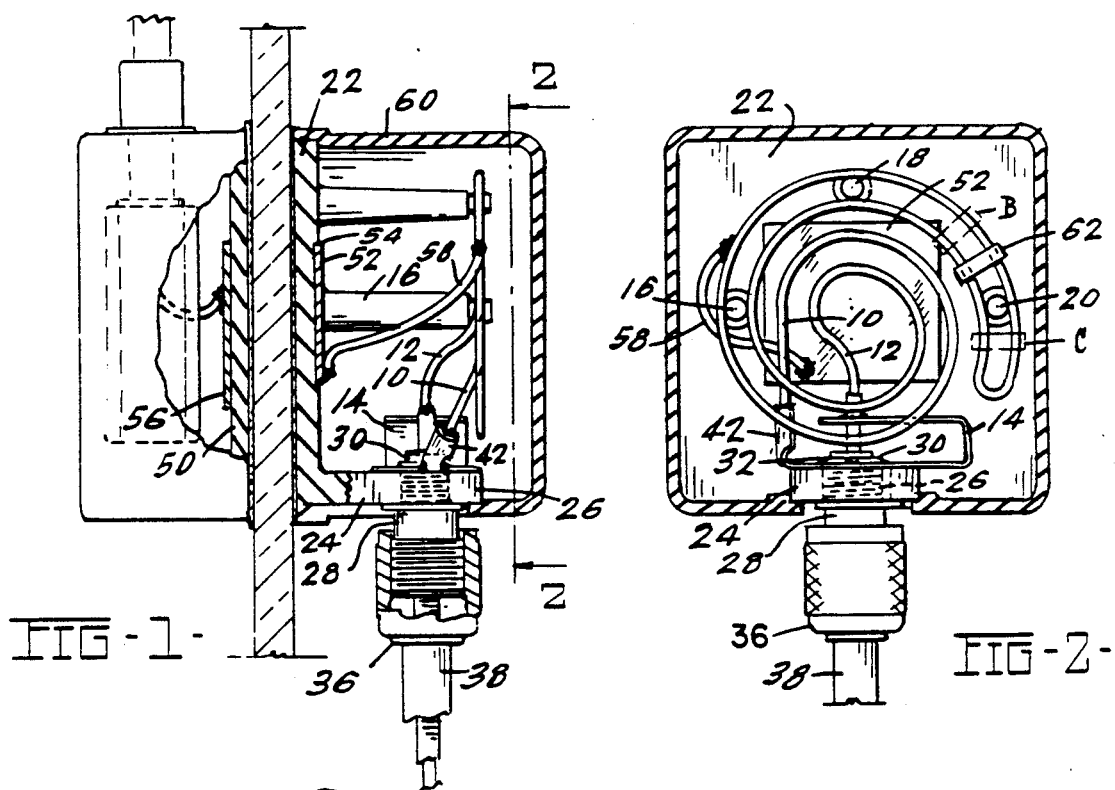
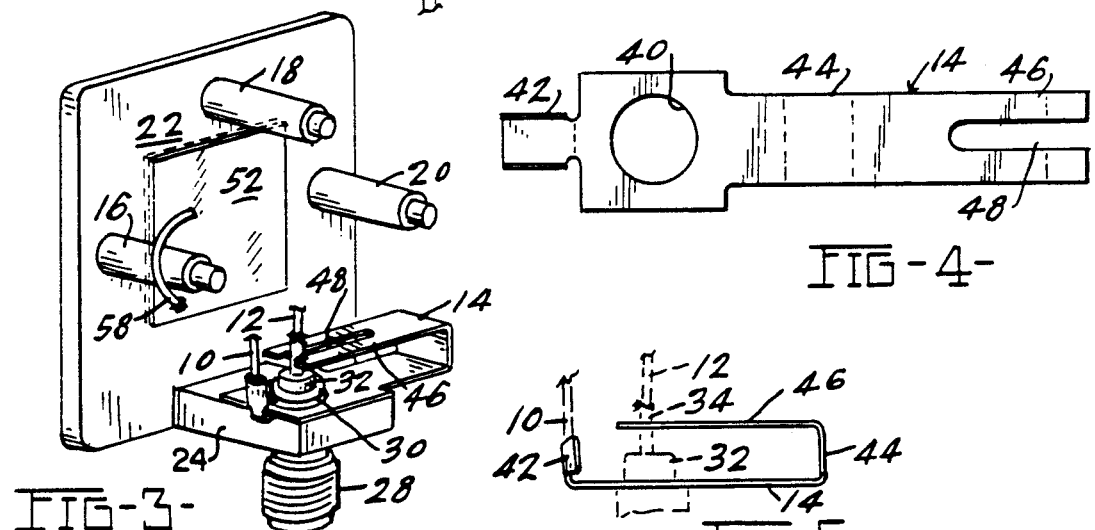
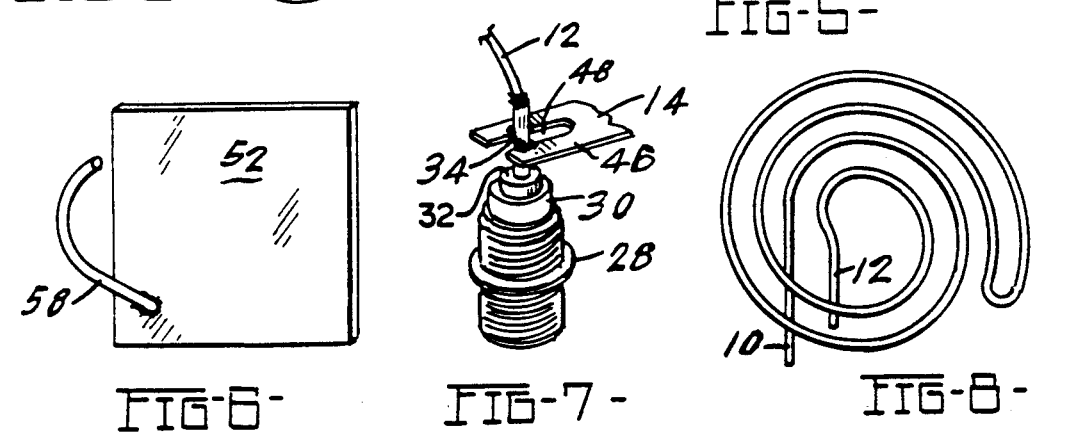

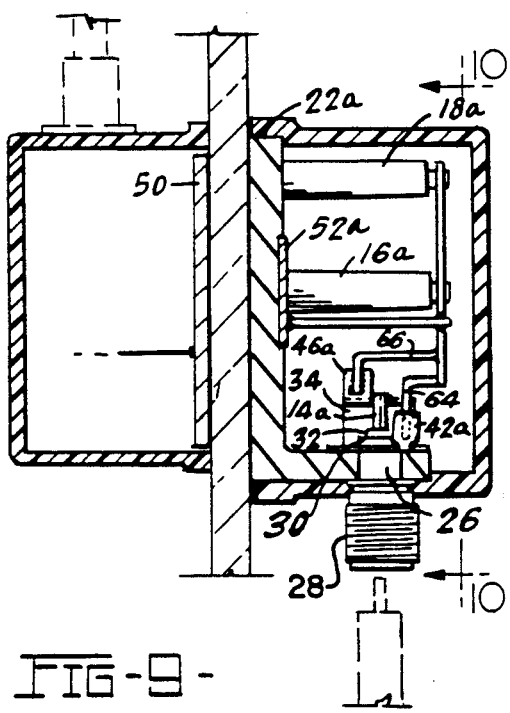
FIG-9-
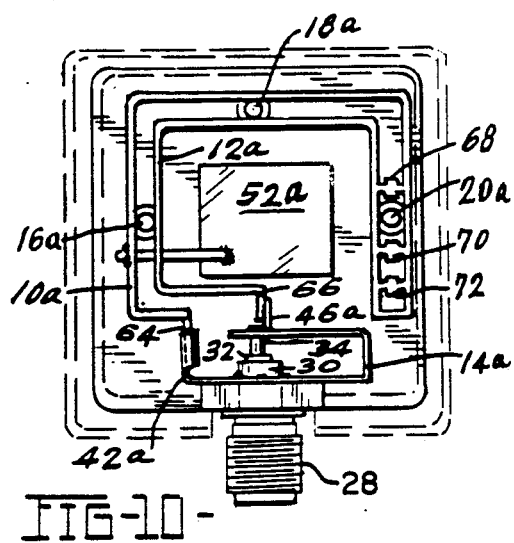
FIG-10-
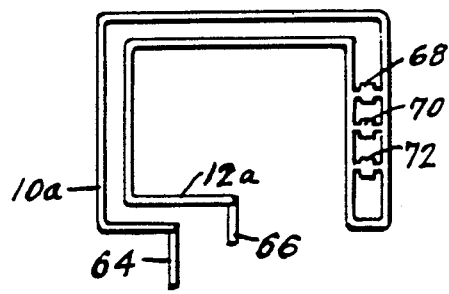
FIG-11-

TRANSMISSION LINE COUPLING DEVICE WITH CLOSED IMPEDANCE MATCHING LOOP

The present application is a continuation in part of my copending application Ser. No. 162,633 filed Mar. 1, 1988, now abandoned.

TECHNICAL FIELD

The present invention relates to coupling devices for transmission lines; and more particularly to such devices which will couple across a layer of dielectric material, such as plastic or glass.

BACKGROUND OF THE INVENTION

The prior art devices with which I am aware give off stray radiation such that their oscillating frequency is affected by structures adjacent the devices when installed, as well as by atmospheric conditions. Since such devices are sensitive to the environment in which they are installed, they must either be provided with means for adjustment after installation, or else are left to operate after installation at less than the best efficiency of which they are capable.

An object of the present invention is the provision of a new and improved device for coupling a two element transmission line of one impedance to an antenna or other device of another impedance by means of a transformer structure which will not be appreciably affected by surrounding structures.

Another object of the present invention is the provision of a new and improved transformer of the above described type comprising a loop conductor of such length as to produce a standing wave therein having impedances which vary around the loop; so that the input can be connected to the loop at its impedance, and the output can be connected to the loop at its impedance.

A further object of the present invention is the provision of a new and improved device of the above described type wherein the loop conductor surrounds a permeable material which enhances the magnetic field produced by the conductor and so enhances the efficiency of the device.

Still further objects and advantages of the invention will become apparent to those skilled in the art to which the invention relates from the following description of the preferred embodiments described with reference to the accompanying drawings forming a part of this specification.

BRIEF SUMMARY OF THE INVENTION

The transformer used in the coupling device of the present invention broadly comprises a loop of approximately a full wave length having a wave therein with impedance peaks and nodes. By connecting the input conductors to the loop at points corresponding to the characteristic impedance of the input conductors, the wave may or may not extend into the input conductors depending on the frequency transmitted and the length of the loop. The output conductors are connected to the loop at points corresponding to the characteristic impedance of the output conductor. A permeable material in the magnetic field of the conductors forming the loop intensifies the field and can shorten the length required to accommodate the wave. The loop can be made by two wires having their ends connected together and each having a length accommodating a half length of transmitted frequency.

In one application, the invention is used to drive a whip antenna mounted on one side of a layer of dielectric material while the transformer is mounted on the other side of the layer of dielectric material with no direct electrical connection therebetween. The whip antenna is connected to one plate of a coupling capacitor which is adhered to one surface of the dielectric layer. The other plate of the coupling is adhered to the opposite side of the dielectric layer and is connected to the transformer. Obviously the impedance of the transformer connected plate of the coupling capacitor must be specifically tailored to match that of the antenna connected plate.

BRIEF DESCRIPTION OF THE DRAWINGS

FIG. 1 is a sectional view of one embodiment of the invention shown adhered to a glass panel with an antenna mount containing a capacitive plate that is electrically connected to a whip antenna adhered to the opposite side of the glass.

FIG. 2 is a sectional view taken approximately on the line 2—2 of FIG. 1.

FIG. 3 is an oblique view of a plastic support body also shown in FIGS. 1 and 2 with a capacitive plate and a terminal strip affixed to a coaxial cable connector.

FIG. 4 is the terminal strip shown in FIGS. 1-3, but in its as stamped, unbent, condition.

FIG. 5 is an edge view of the terminal strip shown in FIGS. 1-4.

FIG. 6 is an oblique view of the capacitive plate shown in FIGS. 1-3.

FIG. 7 is a fragmentary oblique view of the electrical connection to the input coaxial connector.

FIG. 8 is a plan view of the spirally wound twin transformer wires shown in FIGS. 1 and 2.

FIG. 9 is a vertical sectional view similar to FIG. 1 but showing another embodiment of the invention.

FIG. 10 is a sectional view taken approximately on the line 10—10 of FIG. 9.

FIG. 11 is a plan view of a sheet metal stamping shown in FIGS. 9 and 10.

DESCRIPTION OF THE PREFERRED EMBODIMENTS

According to principles of the present invention, a transmission line of a given impedance is coupled to a device having another impedance by means of a transformer comprising a pair conductors each having a wave which is equal and opposite to the wave in the other. According to further principles of the invention, spaced apart input connections to the conductors are made at points having the same impedance as the impedance of the input transmission line, and output connections to the conductors are made at spaced apart points having an impedance matching that of the device to which they are to be connected.

Figure 15:
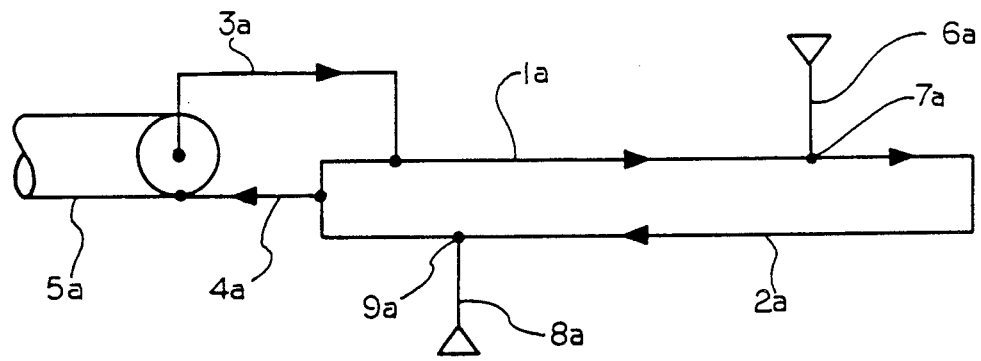
FIG. 15 is a schematic of one embodiment of the invention having: a closed loop conductor with an air core, input terminals of a low impedance matching that of a coaxial cable, and two output terminals having impedances matching that of respective quarter wave length antenna elements.

In the type of device shown schematically in FIG. 15, a pair of conductors 1a and 2a, each of such a length as to accommodate a one half wave length of the transmitted frequency are joined together at both ends to form a loop. The two conductors 3a and 4a of a coaxial input cable 5a are connected to the loop with 4a being at ground potential and 3a being connected to conductor 1a at a point having the characteristic impedance of the coaxial cable 5a. An antenna 6a is connected to a point 7a on conductor 1a having the characteristic impedance of the antenna 6a, and another antenna 8a is connected to a point 9a having the impedance of antenna 8a. The antennas 6a and 8a may be the respective elements of a half wave length dipole antenna. The device of FIG. 15 has an air core.

Figure 16:
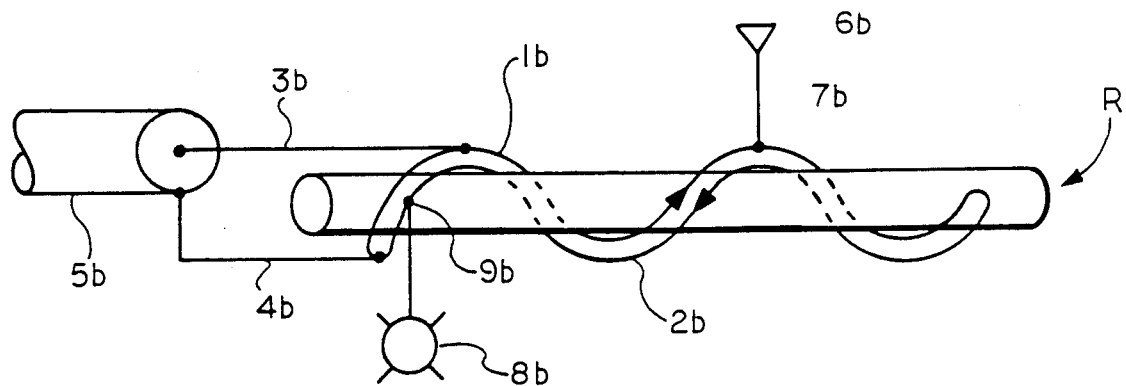
FIG. 16 is a schematic of another embodiment of the invention which differs from the embodiment shown in FIG. 15 principally in that the closed loop conductor is wrapped around a permeable core, with one of the outputs driving the vertical element, while the other drives a ground plane element of a vertical ground plane antenna.

The type of device shown schematically in FIG. 16, is generally similar to that shown in FIG. 15 — differing principally in that the conductors 1b and 2b are wrapped around a rod 9 of permeable material. Those portions of FIG. 16 which correspond to portions of FIG. 15 are designated by a like reference numeral excepting that the suffix is changed to "b". In FIG. 16, the antenna 8b is a ground plane element and is connected to a terminal 9b having its characteristic impedance.

Figure 17:
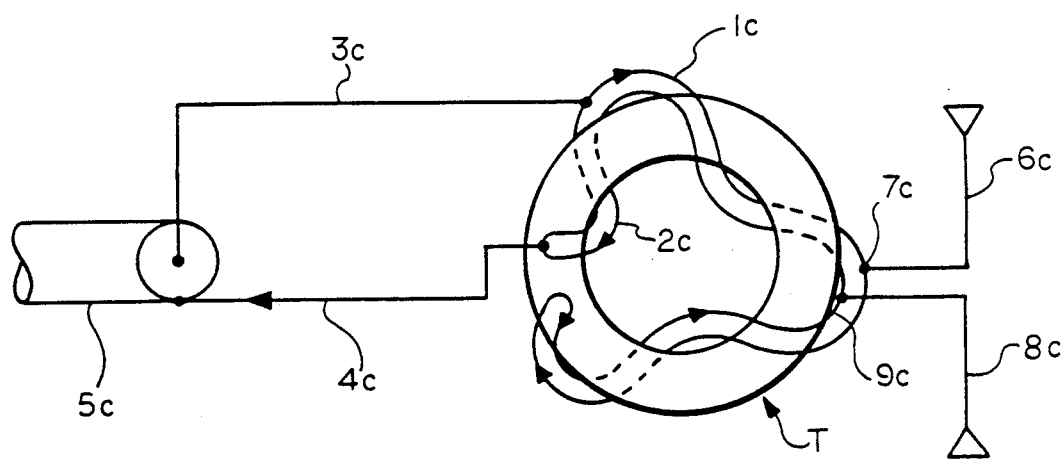
FIG. 17 is a schematic of another embodiment of the invention which differs from the embodiment shown in FIG. 16 principally in that the permeable core is a continuous ring or torus, and the two outlets drive the opposite half wave elements of a collinear array antenna.

The type of device shown schematically in FIG. 17 is generally similar to that shown in FIG. 16 — differing principally in that the conductors 1c and 2c are wrapped around a ring or torus of permeable material. Those portions of FIG. 17 which correspond to portions of FIG. 16 are designated by a like reference numeral excepting that the suffix is changed to "c". In addition the elements 6c and 8c are connected to the loop at points having the characteristic high impedance of the respective half wave elements of a driven collinear array.

In the embodiment shown in FIGS. 1 through 8, the two conductors 1 and 2 previously referred to are made from a pair of spirally coiled wires 10 and 12, and a stamped sheet metal terminal strip 14. In the transformer shown in the drawing, the conductors 10 and 12 are made integral at one end and are supported by three pedestals 16, 18 and 20 that are molded onto a plastic base 22 having an integral plastic terminal support 24. The terminal support 24 has an opening 26 therethrough into which a coaxial cable receptacle 28 is pressed. The receptacle 28 comprises a tubular conducting barrel 30, an inner tubular insulating sleeve 32, (see FIGS. 2, 5 and 7) an axially extending conducting pin 34, and a threaded nut 36 for securing the usual coaxial cable terminal to the receptacle 28.

The sheet metal terminal strip 14 (see FIG. 4 is bent U-shaped to provide a transverse center section 44 and has an opening 40 through one end for receiving the conducting metal barrel 30, a soldering tab 42 adjacent the opening 40, and the distance from the opening 40 to the terminal 34 are chosen so that their lengths when added to the lengths of the conductors 10 and 12 will give equal total conductors 10 and 12 and zero phase shift. The distance from opening 40 to the terminal 34 (see FIGS. 4 and 5) is chosen so that the distance therebetween relative to the total conductor length will give an impedance which matches that of the coaxial cable attached to terminal 34. The terminal strip is soldered to the conducting barrel 30, the end of conductor 10 is soldered to terminal pin 34, and the end of conductor 12 is soldered to terminal pin 34 last.

The transformer shown in FIGS. 1–8 can be used to pass an RF signal through a panel of dielectric material, be it plastic, glass, etc. Because the transformer of the present invention does not put out stray radiation, it can be used to pass the signal to another section of coaxial cable, or to a discrete piece of RF equipment, such as an amplifier or antenna. FIG. 1 illustrates how an antenna that is secured to a plastic base 50, similar to the plastic base 22 can be adhered to the dielectric panel (glass, etc.) directly opposite each other.

The transformer shown in the drawings is provided with a large size capacitive plate 52 received in a recess 54 (see FIG. 1) in the base 22. The opposite plastic base 50 has a similar capacitive plate 56 (see FIG. 1) connected to the antenna. The antenna and its capacitive plate 56 have a characteristic impedance depending on the type of antenna and its design. The transformer of the present invention is easily tailor made to match the impedance of the device to which it is to be coupled by connecting its capacitive plate 52 to the appropriate impedance points of the conductor 10. As shown in the drawings, this is accomplished by a branch wire 58 one end of which is soldered to the plate 52 and the other end of which is soldered to the conductor 10 at the appropriate length from the opening 40 in the terminal strip 14. The assembly so far described is protected from the weather by a square plastic cap 60 (see FIG. 1) that is cemented to its base 22.

While it is not a necessary part of the invention, the transformer shown in the drawings includes a shorting bar 62 that is crimped across the wires 10 and 12 to electrically adjust their lengths to provide a standing wave at a desired frequency. The shorting bar 62 permits a unit of basic manufacture to be tuned to a wide range of frequencies by a simple crimping operation. By making the length of the conductors 10 and 12 such that they oscillate at the desired frequency when the shorting bar 62 is positioned as shown in FIG. 2, the transformer can easily be changed to oscillate at a higher RF frequency by moving the shorting bar 62 to the position B, and can be made to oscillate at a lower frequency by moving to the position C. By a complete removal of the bar 62, a still lower frequency is provided.

In operation, standing waves are produced in the conductors 10 and 12 between the opening 40 in the sheet metal terminal strip 14 and their other electrical end be it their hair pin end union, or the shorting bar 62, as the case may be. There will be substantially zero impedance at opening 40 and a maximum impedance at a location in conductors 10 and, 12 one quarter wave length away from opening 40 at the operating frequency. The point on slot 48 at which the coaxial cable conductor 34 is connected to conductor 12 has an impedance depending on the ratio of its distance from opening 40, relative to the total distance from opening 40 to the shorting bar 62. The impedance at the point where wire 58 is soldered to conductor 10 will be the ratio of the distance it is from the opening 40 to the distance between opening 40 and bar 62. This ratio is selected to match that at the capacitive plate 56 of the driven device. The precise locations of contact with leg 46 and the connection of wire 58 to conductor 10 are best precisely determined by actual measurement before production is begun, since once so established, individual adjustment is not necessary.

The embodiment shown in FIGS. 9-11 is generally similar to the embodiment shown in FIGS. 1-8, but differs principally therefrom in that the electrical conductors are made from a preform such as a sheet metal stamping, or from a printed circuit board. Those portions of the embodiment shown in FIGS. 9-11 which correspond to similar portions of the embodiment shown in FIGS. 1-8 are designated by a like reference numeral characterized further in that a suffix "a" is affixed thereto.

The sheet metal terminal strip 14a is generally similar to the terminal strip 14 excepting that the end of leg 46a on the bottom side of slot 48a is bent out to form a soldering terminal for conductor 12a. The conductors 10a and 12a are part of a sheet metal stamping that includes L-shaped projections 64 and 66, respectively, which are bent down to make contact with tabs 42a and the tab on leg 46a.

Obviously, it is possible to replace the sheet metal terminal strip 14 with wire by making the conductors 10a and 12a longer, so that each extends all the way to the metal barrel 30 of the coaxial cable receptacle 28. This makes soldering very difficult however. Instead, the use of sheet metal terminal strip 14 permits metal barrel 30 to be soldered to strip 14, and leg 46a to be soldered to pin 34 before conductors 10a and 12a are in position. Thereafter conductor 10 can be more easily soldered to tab 42, and conductor 12a more easily soldered to leg 42a, since they are at more accessible, yet precise locations. The shorting bar 62 of the embodiment of FIGS. 1-8 is replaced in the present embodiment by integral connectors 68, 70 and 72. Connector 68 corresponds to position B, and 72 corresponds to position C. Removal of connector 68, makes connector 70 the effective shorting bar and the removal of both connectors 68 and 70, makes connector 72 the effective shorting bar.

In the embodiments above described, the length of the electrical conductors and legs of the sheet metal terminal strips to which they are connected give total electrical lengths that provide equal but opposite waves and in which all points of one conductor are opposite points on the other conductor having an equal but opposite charge and magnetic field as occurs when the electrical lengths are multiples of one half of the transmitted wave length.

Figure 12:
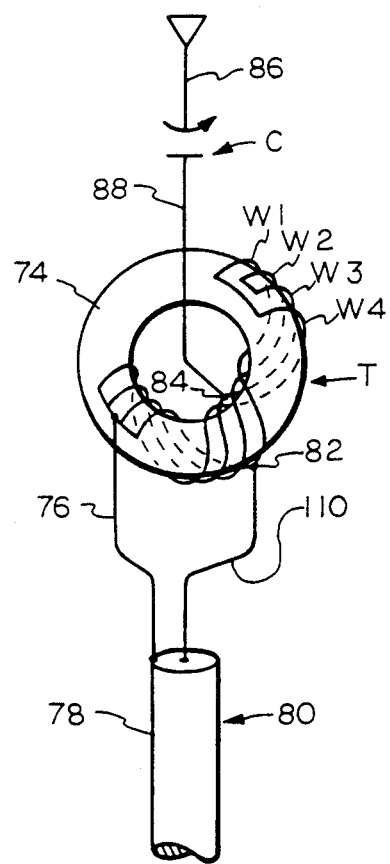
FIG. 12 is a schematic view of an embodiment of antenna using the torus type transformer depicted in FIG. C.

The embodiment shown schematically in FIG. 12 is generally similar to that shown in FIG. B, but differs principally in that the permeable material of the transformer is in the shape of a torus 74 which is quadrafilar wound and with the ends of the windings suitably connected to provide two conductors having equal and opposite half waves. In addition the transformer T feds the antenna through a capacitor C that is adjustable to tune the antenna for maximum performance.

The transformer T is conveniently made by winding four color coded wires w1, w2, w3, and w4 each of a length to accommodate a one quarter wave length when wound on the permeable material, at the transmitted frequency. The four wires w1, w2, w3 and w4 are wound around the torus 74 following which one end of wires w2 and w3 are soldered together. This provides two conductors each accommodating one half of a wave length of transmitted energy. Because the opposite ends of a half wave are at zero potential, the opposite ends of wires w1, w2, w3 and w4 can be connected together, and in turn be connected by conductor 76 to the outside conductor 78 of coaxial cable 80. The center conductor of coaxial cable 80 is connected to conductor w1 at an input terminal 82 having the characteristic impedance of coaxial cable 80. Conductor w3 is provided with an output terminal 84 at or near the characteristic impedance of the capacitor coupled antenna 86. Conductor 88 connects terminal 84 to the variable capacitor C.

Figure 13:
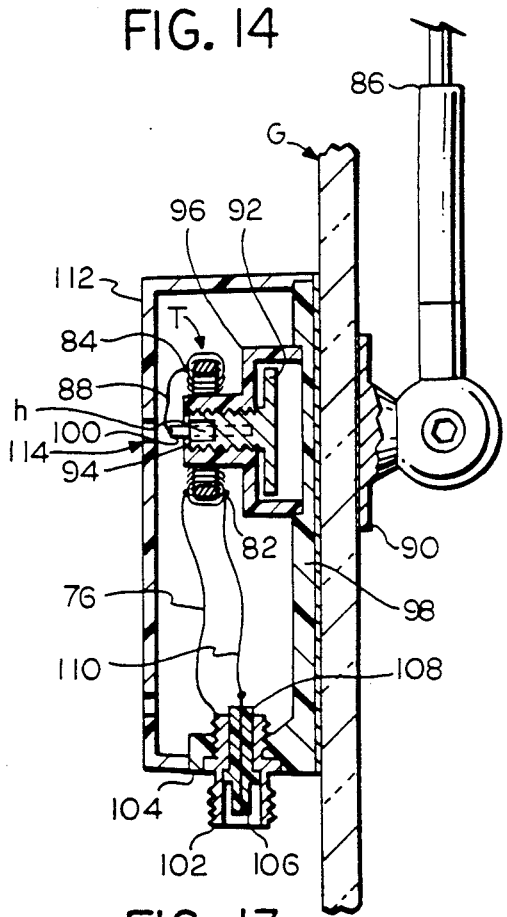
FIG. 13 is a vertical view, with portions sectioned of, the device depicted in FIG. 12.

The antenna 86 is intended to be mounted on the outside of a vehicle, and the variable capacitor C is constructed and arranged to fed through a dielectric material such as glass or fiberglass G, as best seen in FIG. 13. The antenna 86 is pivotably supported on a base 90 that is cemented to the outside of the dielectric material G, and which forms one plate of the capacitor C. The opposite plate 92 of the capacitor C is carried by a threaded stem 94 that is threaded through a plastic cup 96. The open end of the plastic cup 96 is cemented to a plastic base 98 which in turn is cemented to the inside of the dielectric material G opposite plate 90. The stem 94 has a hexagonally shaped opening h therein by which the stem 94 and plate 92 can be threaded toward or away from the plate 90. A metal insert 100 engages the stem 94. Conductor 88 connects the output terminal 84 of transformer T to the metal insert 100. The transformer T and comprising torus 74 and wound conductors w1, w2, w3 and w4 surround the plastic cup 96 and are suitable affixed thereto.

The coaxial cable 80 can be connected to the transformer T in any suitable manner. Conveniently, a conventional coaxial connector comprising a threaded metal barrel 102 is held in a plastic pedestel 104 that is formed integrally with the base 98. An axially extending pin 106 is insulated from the barrel 102 by a plastic sleeve 108. One end of a conductor 110 is soldered to pin 106 and the other end to terminal 82 as at 101 (see FIG. 14). Conductor is soldered to barrel 102. A conventional coaxial cable end, not shown, is received into the lower end of barrel 102 and its nut, not shown, is threaded onto the outside of barrel 102. A cup shaped plastic cover 112 fits down over the transformer T and pedestal 104 and is cemented to the base 98 and pedestal 102. An opening 114 in the cover 112 opposite the stem 94 allows a tool to be inserted into the hexagonally shaped opening h in stem 94 for adjusting the position of plate 92.

Figure 14:
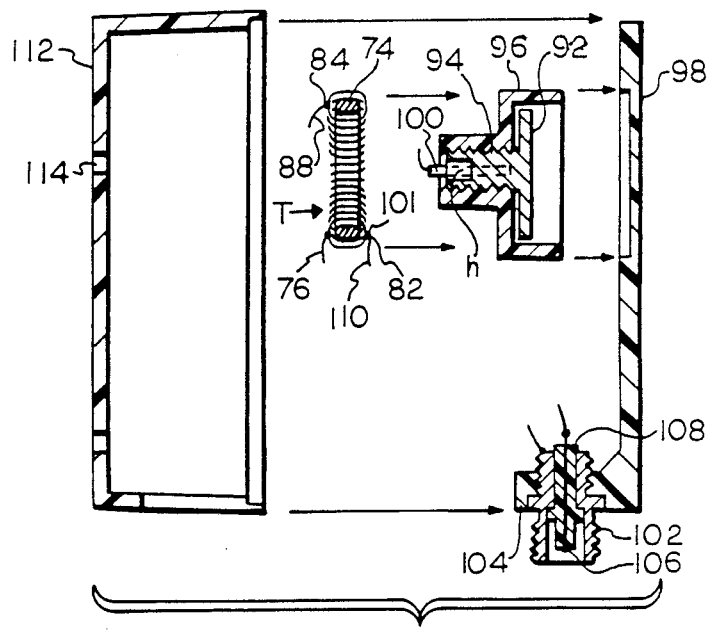
FIG. 14 is an exploded view of the portions of the device shown in FIG. 13.

FIG. 14 shows the various pieces of the transformer T and capacitor C in intermediate stages of assembly. The cup 96 containing the plate 92 is cemented to the base 98, the wound torus 74 is fixed around the cup 96, and the conductors 76, 88 and are soldered to their respective terminals. Thereafter the cover 112 is telescoped into position over the internal parts and is cemented in place.

It will be seen that the embodiment shown in FIGS. 12 through 14 can be used to handle frequencies having relatively long standing waves, as occur in lower frequencies, because of the use of the permeable material, and the long length of wires w1, w2, w3 and w4 which can be wound onto the torus 74.

While the invention has been described in considerable detail, I do not wish to be limited to the particular embodiments shown or described; and it is my intention to cover hereby all novel adaptations, modifications, and arrangements thereof which come within the practice of those skilled in the art to which the invention relates and which come within the purview of the following claims.

I claim:

1. A method of producing an accurate impedance match between first and second two conductor transmission lines having first and second impedances respectively, said method comprising: producing a preform having two conductor legs with each leg having respective first and second ends and with respective first and second ends being connected together to form a closed loop, and said second ends providing a first terminal for attachment to one conductor of the first transmission line, said closed loop providing a fixed range of impedances therealong; attaching one conductor of said first transmission line to said first terminal and attaching the other conductor of the first transmission line to a point on said preform having the impedance of said first transmission line; and coupling a conductor of said second transmission line to a point on said preform having the impedance of said second transmission line.

2. A transmission line coupling device for electrical wave energy, comprising: a closed resonating conductive loop devoid of discontinuities and accommodating a wave of transmitted energy to provide a fixed range of impedance points which vary around the loop from approximately zero to a maximum, said loop having a pair of input terminals spaced apart along the loop by a distance corresponding to a given difference in impedance; and at least a first output terminal on said loop spaced apart from one of said input terminals by a distance having a desired output impedance.

3. The coupling device of claim 2 wherein said resonating loop is wrapped around a magnetically permeable member.

4. The coupling device of claim 2 wherein said resonating loop produces a magnetic field, and said device includes a magnetic flux enhancing material oriented to increase the flux of said magnetic field.

5. The assembly of claim 2 arranged for driving a half wave dipole antenna of desired impedance and including: a second output terminal on said loop, said first and second output terminals being spaced apart at points on said loop having the desired impedance of each pole of the half wave dipole antenna.

6. The assembly of claim 2 arranged for driving a two element vertical ground plane antenna, with a vertical element adapted for connection to said first output terminal and including: a second output terminal on said loop, said first and second output terminals being spaced part at generally opposite points on said loop wherein said loop has generally opposite polarities required for said respective elements of said two element vertical ground plane antenna.

7. The assembly of claim 2 arranged for driving a two element full wave dipole antenna, and wherein said first output terminal has the impedance of one element of the full wave dipole antenna, and including a second output terminal on said loop located generally opposite said first output terminal but at a point having the impedance of the second element of said full wave dipole antenna.

8. An assembly for coupling a two element transmission line of characteristic impedance to a first driven device having a given impedance, said assembly comprising: a closed loop conductor devoid of discontinuities at any point along the loop and constructed and arranged to have a standing wave therein to give a fixed range of impedance values along the loop; an output terminal disposed on said loop conductor at a point having said given impedance of said first driven device; and said closed loop conductor also having a pair of input terminals for respective elements of said transmission line and which are disposed at spaced apart points on said loop and having therebetween the characteristic impedance of the two element transmission line.

9. The assembly of claim 8 wherein said loop is wrapped around a magnetically permeable member.

10. The assembly of claim 8 for also driving a second device of second given impedance and having a second set of output terminals disposed on said closed loop conductor positioned to give said second given impedance therebetween.

11. An assembly for coupling a two element transmission line of characteristic impedance to a driven device having a given impedance, said assembly comprising: a pair of conductors having respective opposite ends, said pair of conductors being directly connected together at respective opposite ends to form a closed loop devoid of discontinuities, each one of said pair of conductors being adapted to resonate at a generally predetermined frequency to produce generally equal and opposite standing wave portions in the pair of conductors to provide a fixed range of impedance values which vary according to the position of the standing wave along the pair of conductors; an output terminal for driving said driven device, said output terminal being electrically connected to a point on one of said pair of conductors where said standing wave gives said given impedance; and said pair of conductors also having a pair of input terminals for respective elements of said two element transmission line and electrically connected at points where said standing wave has the characteristic impedance of the two element transmission line.

12. An assembly for coupling a two element transmission line of characteristic impedance to a first driven device having a given impedance, said assembly comprising: a pair of conductors each having respective first and second opposite ends and being constructed and arranged to resonate at a given transmitted frequency with generally equal and opposite standing wave portions; respective ends of said pair of conductors being connected together in such manner as to be devoid of radiating discontinuities and give a range of fixed impedance values depending on the position along the pair of conductors; said pair of conductors having a pair of input terminals for respective elements of said two element transmission line and which are disposed at spaced apart points along said pair of conductors having the characteristic impedance of the two element transmission line to which it is to be connected; and said conductors having a first output terminal disposed at a point along said pair of conductors having the given impedance of the first driven device.

13. The assembly of claim 12 wherein said conductors comprise a printed circuit preform to provide accurate conductor lengths and spacing.

14. The assembly of claim 12 wherein said pair of conductors is wrapped around a magnetically permeable member.

15. The assembly of claim 12 wherein said pair of conductors comprise: a generally hairpin shaped conductor having two open ended legs forming said pair of conductors and integrally connected together by a center transverse section of said hairpin conductor; and a sheet metal terminal strip having said spaced apart input terminals and connected across the open end of said generally hairpin shaped conductor.

16. The assembly of claim 12 wherein each of said conductors has an electrical length of approximately a one half wave length of the transmitted frequency.

17. The assembly of claim 12 including a shorting bar disposed across said conductors intermediate their first and second ends to vary the effective electrical length of said pair of conductors.

18. The assembly of claim 12 wherein said conductors comprise integral legs of a sheet metal stamping to provide accurate conductor lengths and spacing.

19. The assembly of claim 18 including an integral shorting bar disposed between conductor of said pair which can be easily removed to increase the electrical length of said pair of conductors.

* * * * *